(12) United States Patent
Li et al.

(10) Patent No.: US 9,035,397 B2
(45) Date of Patent: May 19, 2015

(54) GATE STRUCTURE AND MANUFACTURING METHOD THEREOF

(71) Applicant: Semiconductor Manufacturing International Corporation (Shanghai), Shanghai (CN)

(72) Inventors: Aileen Li, Shanghai (CN); Jinghua Ni, Shanghai (CN); David Han, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 39 days.

(21) Appl. No.: 13/923,943

(22) Filed: Jun. 21, 2013

(65) Prior Publication Data

US 2014/0117463 A1     May 1, 2014

(30) Foreign Application Priority Data

Oct. 30, 2012    (CN) .......................... 2012 1 0422214

(51) Int. Cl.
| | |
|---|---|
| *H01L 29/78* | (2006.01) |
| *H01L 21/28* | (2006.01) |
| *H01L 29/49* | (2006.01) |
| *H01L 29/66* | (2006.01) |
| *H01L 29/51* | (2006.01) |

(52) U.S. Cl.
CPC ...... *H01L 21/28088* (2013.01); *H01L 29/4966* (2013.01); *H01L 29/66545* (2013.01); *H01L 29/513* (2013.01); *H01L 29/517* (2013.01)

(58) Field of Classification Search
CPC . H01L 29/78; H01L 29/66545; H01L 29/517; H01L 29/4966; H01L 29/6659; H01L 21/28088; H01L 29/665; H01L 21/28518; H01L 21/76897; H01L 21/823443
USPC .......................... 257/410, 369, 411, 412, 296
See application file for complete search history.

(56) References Cited

U.S. PATENT DOCUMENTS

| | | | |
|---|---|---|---|
| 2011/0140207 A1* | 6/2011 | Lin et al. ........................ | 257/412 |
| 2012/0139061 A1* | 6/2012 | Ramachandran et al. .... | 257/410 |

OTHER PUBLICATIONS

M. Mackenzie, et al., "Interfacial reactions in a HfO2/TiN/poly0Si gate stack", Applied Physics Letter 88, 192112 (2006), 4 pages.

* cited by examiner

*Primary Examiner* — Chuong A Luu
*Assistant Examiner* — Rodolfo Fortich
(74) *Attorney, Agent, or Firm* — Innovation Counsel LLP

(57) ABSTRACT

A method for manufacturing a gate structure may include the following steps: providing a stack on a substrate, the first stack including (from top to bottom) a dummy layer, a first TiN layer, a TaN layer, a second TiN layer, a high-k first dielectric layer, and an interfacial layer; etching the stack to result in a remaining stack that includes at least a remaining dummy layer, a first remaining TiN layer, and a remaining TaN layer; providing an etching stop layer on the substrate; providing a second dielectric layer on the etching stop layer; performing planarization according to the remaining dummy layer; removing the remaining dummy layer and a first portion of the first remaining TiN layer using a dry etching process; removing a second portion of the first remaining TiN layer using a wet etching process; and providing a metal gate layer on the remaining TaN layer.

11 Claims, 6 Drawing Sheets

⇓ Poly-Si Removal

GATE STRUCTURE AND MANUFACTURING METHOD THEREOF

CROSS-REFERENCE TO RELATED APPLICATIONS

This application claims priority to and benefit of Chinese Patent Application No. 201210422214.9, filed on Oct. 30, 2012 and entitled "High-k Metal Gate Structure and Manufacturing Method thereof", which is incorporated herein by reference in its entirety.

1. Field of the Invention

The present invention is related to an integrated circuit device structure and a manufacturing method thereof. More specifically, the present invention is related to a gate structure and a manufacturing method thereof.

2. Description of the Related Art

High-k metal gate (HKMG) technology has been used in integrated circuits of a 45 nm technology node because it can alleviate problems of poly-Si gate depletion, dopant penetration, and high gate sheet resistance.

A gate-last method may be used for forming a high-k metal gate structure. As illustrated in the examples of FIGS. 1 and 2, in a gate-last process that involves a Si substrate 1, as an example, a $SiO_2$ interfacial layer 2, a $HfO_2$-base high-k dielectric layer 3, a TiN layer 4, and a poly-Si gate layer 5 may be sequentially formed on the Si substrate 1, and after the formation of a gate pattern, it may be necessary to firstly remove the poly-Si gate layer and then deposit a metal gate material.

An interface reaction may occur at the interface between the TiN layer 4 and the poly-Si gate layer 5, and an interface reaction product such as SiON may be produced, as illustrated in in FIGS. 1 and 2. Such interface reaction product may adversely affect electrical properties, such as one or more threshold voltages, of the gate structure.

Typically, it is necessary to remove the interface reaction product between TiN and poly-Si. The interface reaction product cannot be completely removed by a wet etching process using HF acid. Conventionally, a dry etching process, such as plasma etching, may be used to remove the interface reaction product. Nevertheless, the high-k dielectric layer 3 may be easily damaged by plasma in plasma etching and may form an uneven surface, as shown in FIG. 3. The uneven surface may adversely affect electrical properties such as one or more of the threshold voltage, the saturation current, and the leakage of the gate structure.

SUMMARY OF THE INVENTION

Embodiments of the invention may completely or substantially remove a TiN surface interfacial layer in manufacturing a gate structure (which may include a high-k dielectric layer) without adversely affecting electrical properties of the gate structure.

One or more embodiments of the invention may be related to a method for manufacturing a gate structure. The method may include providing a first stack on a semiconductor substrate. The first stack may include a dummy layer, a first TiN layer disposed between the dummy layer and the semiconductor substrate, a TaN layer disposed between the first TiN layer and the semiconductor substrate, a second TiN layer disposed between the TaN layer and the semiconductor substrate, a first dielectric layer disposed between the second TiN layer and the semiconductor substrate, and an interfacial layer disposed between the first dielectric layer and the semiconductor substrate. A dielectric constant of the first dielectric layer is greater than a dielectric constant of a silicon oxide material, i.e., the first dielectric layer is a high-k dielectric layer.

The method may further include etching the first stack to result in a remaining stack. The remaining stack may include a remaining dummy layer, a first remaining TiN layer disposed between the remaining dummy layer and the semiconductor substrate, a remaining TaN layer disposed between the first remaining TiN layer and the semiconductor substrate, a second remaining TiN layer disposed between the remaining TaN layer and the semiconductor substrate, a first remaining dielectric layer disposed between the second remaining TiN layer and the semiconductor substrate, and a remaining interfacial layer disposed between the first remaining dielectric layer and the semiconductor substrate.

The method may further include providing a contact etching stop layer on the remaining stack and the semiconductor substrate. The remaining stack may be disposed between the semiconductor substrate and a first portion of the contact etching stop layer;

The method may further include providing a second dielectric layer on the contact etching stop layer. Each of a second portion of the contact etching stop layer and a third portion of the contact etching stop layer may be disposed between the semiconductor substrate and the second dielectric layer.

The method may further include, after the providing the second dielectric layer, performing planarization according to the remaining dummy layer.

The method may further include, after the planarization, removing the remaining dummy layer and a first portion of the first remaining TiN layer using a dry etching process.

The method may further include removing a second portion of the first remaining TiN layer (e.g., the remaining portion of the first remaining TiN layer that remains after the dry etching process) using a wet etching process.

The method may further include providing a metal gate layer on the remaining TaN layer. The remaining TaN layer maybe disposed between the second remaining TiN layer and the metal gate layer.

In one or more embodiments, the interfacial layer includes $SiO_2$ or SiON formed by oxidation.

In one or more embodiments, the first dielectric layer includes one or more of hafnium oxide, hafnium oxide silicon, hafnium oxynitride, hafnium oxynitride silicon, hafnium oxynitride tantalum, zirconium oxide, zirconium oxynitride, zirconium oxynitride silicon, zirconium oxide silicon, lanthanum oxide, titanium oxide, tantalum oxide, barium strontium titanium oxide, barium titanium oxide, strontium titanium oxide, and aluminium oxide. The first dielectric layer maybe formed through atomic layer deposition. The first dielectric layer may have a thickness in a range of 10 Å to 30 Å.

In one or more embodiments, a TiN-TaN-TiN layer that includes the second TiN layer, the TaN layer, and the first TiN layer is formed through atomic layer deposition. The first TiN layer has a thickness in a range of 10 Å to 30 Å, the TaN layer has a thickness in a range of 10 Å to 30 Å, and the second TiN layer has a thickness in a range of 10 Å to 30 Å.

In one or more embodiments, the dummy layer includes poly-Si and is formed through chemical vapour deposition or furnace tube deposition. The dummy layer has a thickness in a range of 400 Å to 800 Å.

In one or more embodiments, the contact etching stop layer includes SiN or SiNO and is formed through chemical vapour deposition.

In one or more embodiments, the interlayer dielectric layer includes $SiO_2$ and is formed through chemical vapour deposition.

In one or more embodiments, the planarization is performed using a chemical-mechanical polishing process.

In one or more embodiments, the dry etching process includes plasma etching.

In one or more embodiments, the wet etching process includes using at least one of a liquid mixture of hydrogen peroxide ($H_2O_2$) and ammonia water ($NH_3OH$) and a liquid mixture of sulphuric acid ($H_2SO_4$) and hydrogen peroxide ($H_2O_2$). The liquid mixture of hydrogen peroxide ($H_2O_2$) and ammonia water ($NH_3OH$) has a temperature in a range of 40° C. to 70° C. and includes (and/or consists of) ammonia water (wt 29%), hydrogen peroxide (wt 31%) and de-ionized water that have a volume ratio of 1:2:50. The liquid mixture of sulphuric acid ($H_2SO_4$) and hydrogen peroxide ($H_2O_2$) has a temperature in a range of 100° C. to 180° C. and includes (and/or consists of) sulphuric acid (wt 98%) and hydrogen peroxide (wt 31%) that have a volume ratio of 4:1.

In one or more embodiments, the metal gate layer includes one or more of Al, Cu, Ag, Au, Pt, Ni, Ti, TiN, TaN, Ta, TaC, TaSiN, W, WN, and WSi.

One or more embodiments of the invention may be related to a gate structure that may include a semiconductor substrate.

The gate structure may further include a stack that is disposed on the semiconductor substrate. The stack may include a metal gate layer, a TaN layer disposed between the metal gate layer and the semiconductor substrate, a TiN layer disposed between the TaN layer and the semiconductor substrate, a first dielectric layer disposed between the TiN layer and the semiconductor substrate, and an interfacial layer disposed between the first dielectric layer and the semiconductor substrate. A dielectric constant of the first dielectric layer is greater than a dielectric constant of a silicon oxide material, i.e., the first dielectric layer is a high-k dielectric layer.

The gate structure may further include a second dielectric layer.

The gate structure may further include a contact layer. A first portion of the contact layer is disposed between a first portion of the second dielectric layer and a side surface of the stack. A second portion of the contact layer is disposed between the first portion of the second dielectric layer and the semiconductor substrate. The second portion of the contact layer is not parallel to the first portion of the contact layer.

In one or more embodiments, the stack is disposed between the first portion of the contact layer and a third portion of the contact layer, and the third portion of the contact layer is disposed between the stack and a second portion of the second dielectric layer.

In one or more embodiments, the interfacial layer includes $SiO_2$ or SiON.

In one or more embodiments, the first dielectric layer includes one or more of hafnium oxide, hafnium oxide silicon, hafnium oxynitride, hafnium oxynitride silicon, hafnium oxynitride tantalum, zirconium oxide, nitrogen oxide zirconium, zirconium oxynitride silicon, zirconium oxide silicon, lanthanum oxide, titanium oxide, tantalum oxide, barium strontium titanium oxide, barium titanium oxide, strontium titanium oxide, and aluminium oxide.

In one or more embodiments, in the TiN layer has a thickness in a range of 10 Å to 30 Å, and the TaN layer has a thickness in a range of 10 Å to 30 Å.

In one or more embodiments, the first dielectric layer has a thickness in a range of 10 Å to 30 Å.

In one or more embodiments, the contact layer includes SiN or SiNO.

In one or more embodiments, the second dielectric layer includes $SiO_2$.

In one or more embodiments, the metal gate layer includes one or more of Al, Cu, Ag, Au, Pt, Ni, Ti, TiN, TaN, Ta, TaC, TaSiN, W, WN, and WSi.

Embodiments of the invention may efficiently and advantageously remove a TiN surface interfacial layer without adversely affecting electrical properties of a gate structure.

Further features and advantages of the present invention will become apparent from the following detailed description with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be better understood by reading the following detailed description with reference to the accompanying drawings.

DESCRIPTION OF THE EMBODIMENTS

Figure 1:
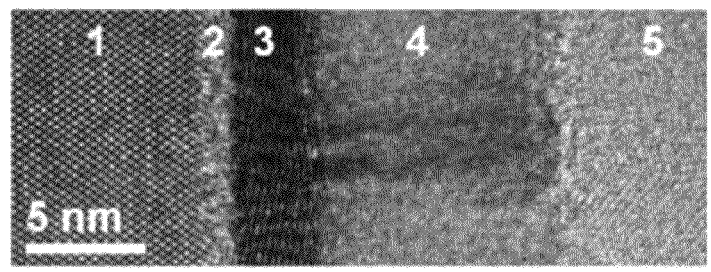
FIG. 1 is a transmission electron microscopy (TEM) provided cross-sectional view showing a structure in which $SiO_x$, $HfO_2$, TiN, and poly-Si are formed sequentially on a Si substrate.
Figure 2:
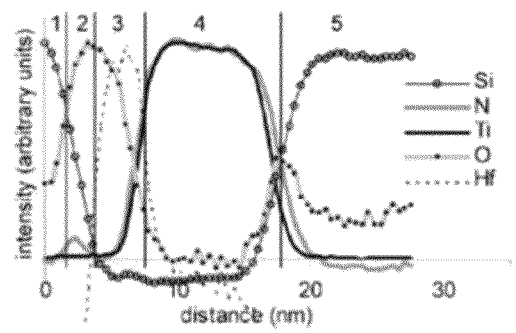
FIG. 2 is an electron energy-loss spectroscopy (EELS) based element profile corresponding to the structure shown in FIG. 1.
Figure 3:
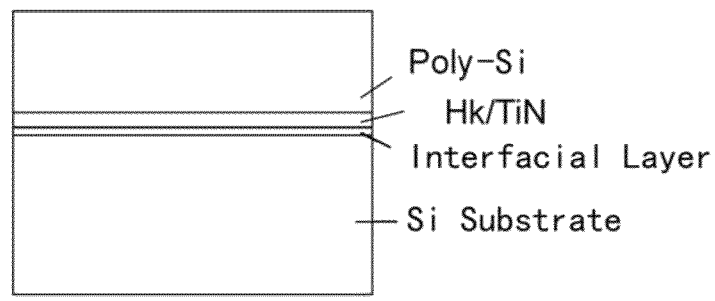
FIG. 3 is a schematic view illustrating a step of removing poly-Si in a gate-last process.
Figure 3:
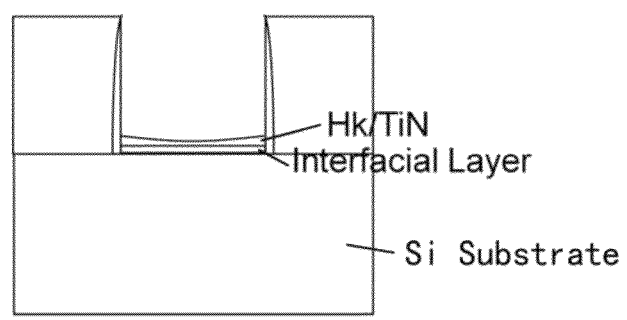

Embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

It should be understood that, for the convenience of description and/or illustration, each component in the figures has not been necessarily drawn to scale.

The following description of one or more embodiments of the invention is merely illustrative in nature and is in no way intended to limit the invention, its application, or uses.

Techniques, methods, and apparatuses as known by one of ordinary skill in the relevant art may not be discussed in detail but are intended to be part of the specification where appropriate.

In examples illustrated and discussed herein, specific values should be interpreted to be illustrative only and non-limiting. Other examples or embodiments could have different values.

Notice that similar reference numerals and letters may refer to similar items in the following figures, and thus once an item has been defined in one figure, it is possible that it needs not be further discussed for following figures.

Figure 4:
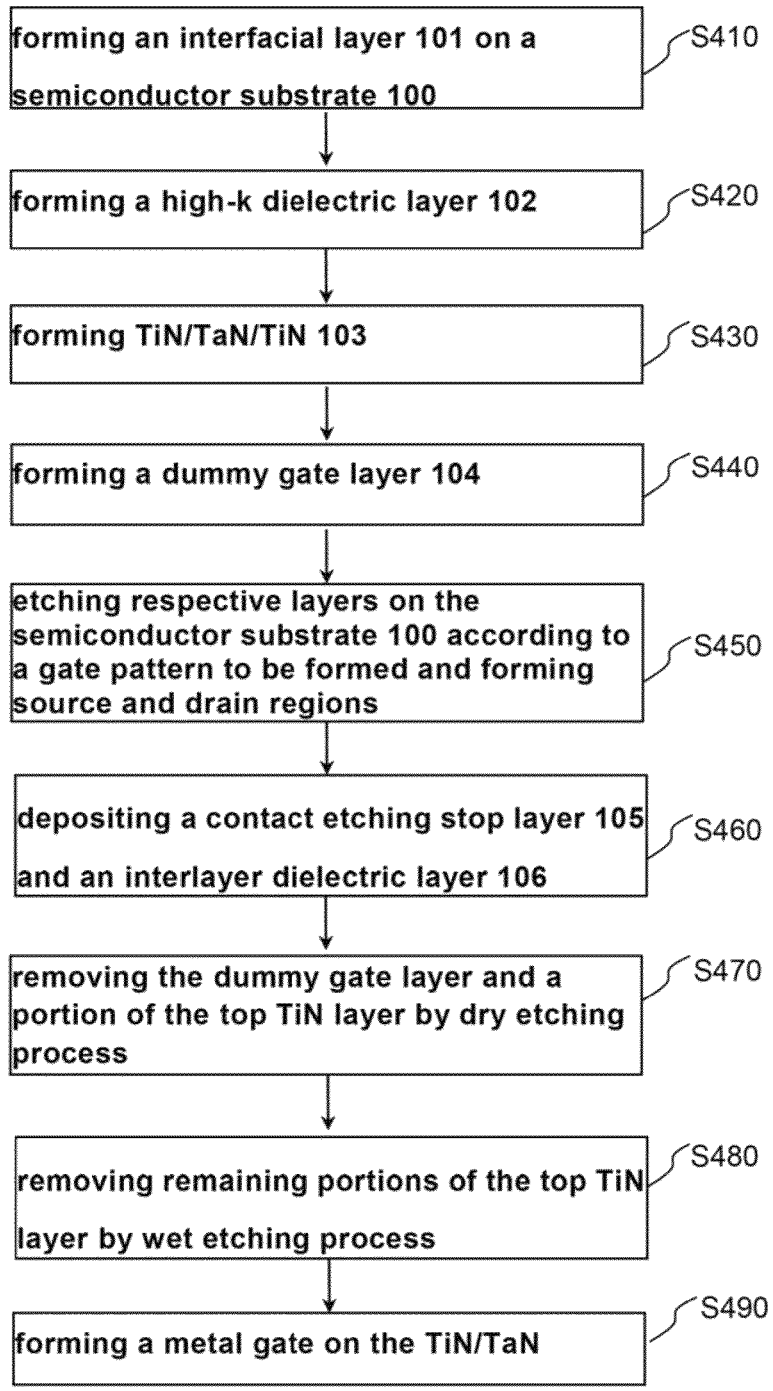
FIG. 4 is a flowchart schematically illustrating a process for manufacturing a high-k metal gate structure according to one or more embodiments of the present invention.

FIG. 4 is a flowchart schematically illustrating a process for manufacturing a high-k metal gate structure according to the embodiments of the present invention.

FIGS. 5A-5G show front views schematically illustrating the high-k metal gate structure at various manufacturing stages according to one or more embodiments of the present invention.

Below, with reference to the process flowchart shown in FIG. 4, views of the high-k metal gate structure at various manufacturing stages according to one or more embodiments of the present invention as illustrated in FIGS. 5A-5G will be described.

At step S410, an interfacial layer 101 is formed on a semiconductor substrate 100.

The material of the semiconductor substrate 100 can include, but not limited to, one or more of Si, Ge, SiGe, SOI (silicon on insulator), SiC, GaAs, and other group III/V compound semiconductors. The semiconductor substrate 100 can also include an epitaxial layer. In one or more embodiments, according to design requirements, the semiconductor substrate 100 can include one or more of various doping configurations. In one or more embodiments of the present invention, the semiconductor substrate 100 may be a Si substrate.

The interfacial layer 101 may include $SiO_2$ (silicon dioxide) and may be formed through one or more processes, such as oxidation.

Subsequently, at step S420, a high-k dielectric layer 102 is formed on the interfacial layer 101. A high-k dielectric layer is a layer formed of a material that has a dielectric constant that is higher than the dielectric constant of $SiO_2$, wherein the dielectric constant of $SiO_2$ may be in the range of about 3.7 to about 3.9.

The high-k dielectric layer 102 can include one or more of hafnium oxide, hafnium oxide silicon, hafnium oxynitride, hafnium oxynitride silicon, hafnium oxynitride tantalum, zirconium oxide, zirconium oxynitride, zirconium oxynitride silicon, zirconium oxide silicon, lanthanum oxide, titanium oxide, tantalum oxide, barium strontium titanium oxide, barium titanium oxide, strontium titanium oxide, and aluminium oxide. In one or more embodiments, the high-k dielectric layer 102 can include $HfO_2$. The high-k dielectric layer 102 can be formed through one or more processes, such as atomic layer deposition, and may have a thickness in a range of about 10~30 Å.

Subsequently, at step S430, a bottom TiN layer/TaN layer/top TiN layer 103 is formed on the high-k dielectric layer 102.

The bottom TiN layer/TaN layer/top TiN layer 103 can be formed through one or more processes, such as atomic layer deposition, wherein the top TiN layer may have a thickness in a range of about 10~30 Å, the TaN layer may have a thickness in a range of about 10~30 Å, and the bottom TiN layer may have a thickness in a range of about 10~30 Å.

Subsequently, at step S440, a dummy gate layer 104 is formed on the bottom TiN layer/TaN layer/top TiN layer 103.

The material of the dummy gate layer 104 can be poly-Si, which can be formed through one or more processes, such as chemical vapour deposition and/or furnace tube deposition. The dummy gate layer 104 may have a thickness in a range of about 400~800 Å.

Figure 5A:
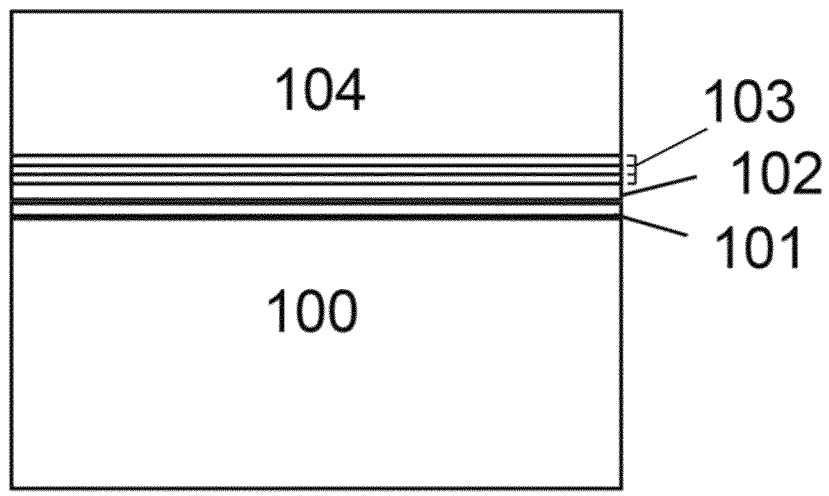
FIGS. 5A, 5B, 5C, 5D, 5E, 5F, and 5G show front views schematically illustrating the high-k metal gate structure at various manufacturing stages according to one or more embodiments of the present invention.

FIG. 5A shows a front view illustrating a structure in which the interfacial layer 101, the high-k dielectric layer 102, the bottom TiN layer/TaN layer/top TiN layer 103, and the dummy gate layer 104 are formed sequentially on the semiconductor substrate 100.

Subsequently, at step S450, the respective layers on the semiconductor substrate 100 are etched according to a gate pattern to be formed, and subsequently, a source region and a drain region are formed. One or more of various etch processes can be used to form the strip gate pattern shown in FIG. 5B. The strip gate patter may include the remaining strip interfacial layer 101, the remaining high-k dielectric layer 102, the remaining bottom TiN layer/TaN layer/top TiN layer 103, and the remaining dummy gate layer 104 stacked sequentially on the semiconductor substrate 100.

Figure 5B:
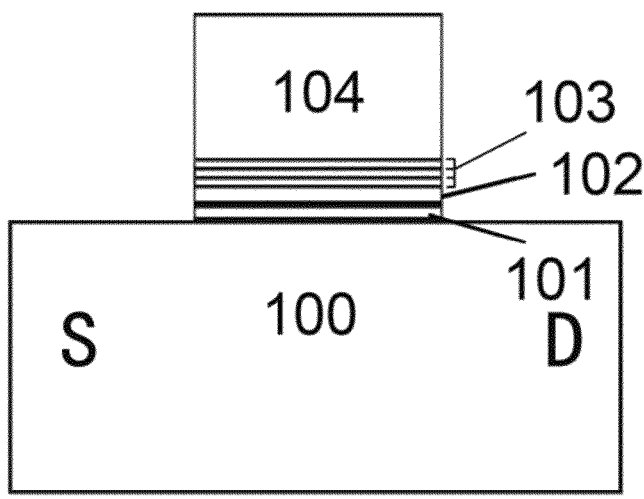
Figure 5C:
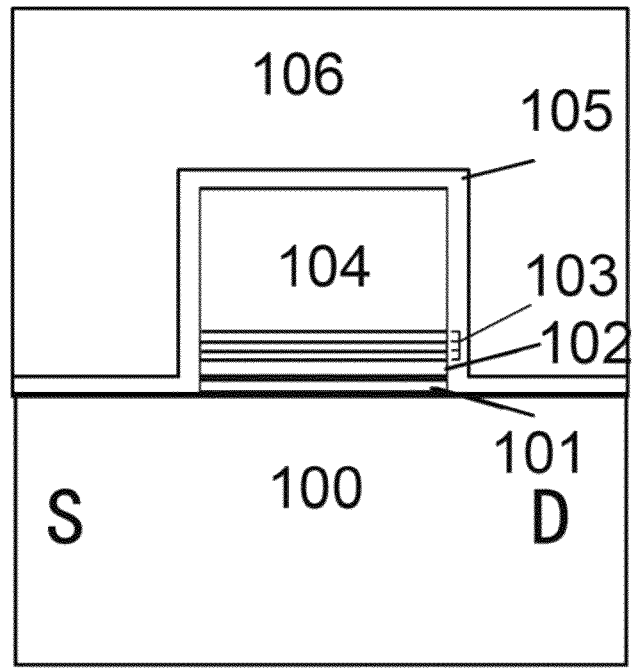

Subsequently, at step S460, on the structure illustrated in FIG. 5B, a contact etching stop layer (CESL) 105 and an interlayer dielectric layer 106 are deposited sequentially, as illustrated in FIG. 5C.

The contact etching stop layer 105 can include SiN and/or SiNO. The contact etching stop layer 105 can be formed through one or more processes, such as chemical vapour deposition.

The interlayer dielectric layer 106 can include $SiO_2$, which can be formed through one or more processes, such as chemical vapour deposition.

Figure 5D:
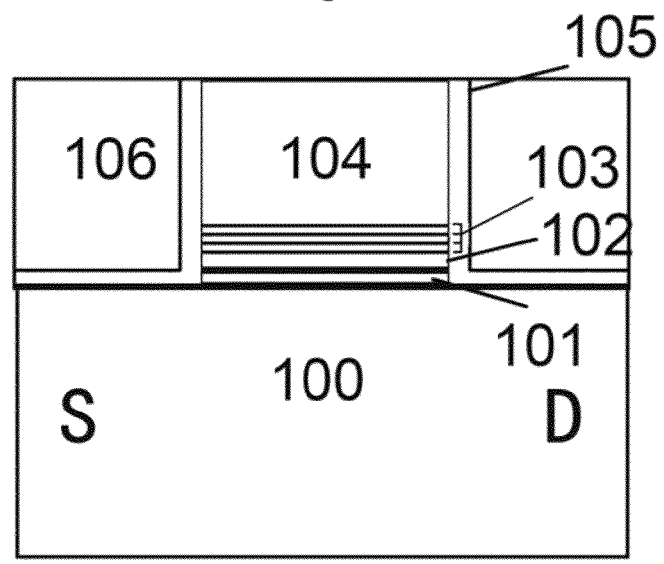

After sequentially depositing the contact etching stop layer 105 and the interlayer dielectric layer 106, planarization can be performed using one or more processes, such as a chemical-mechanical polishing process. This planarization can be performed using the dummy gate layer 104 as a stop layer. With this planarization, the contact etching stop layer 105 and the interlayer dielectric layer 106 on the upper surface of the dummy gate layer 104 can be removed, while the contact etching stop layer 105 and the interlayer dielectric layer 106 adjacent to sides of the dummy gate layer 104 may remain, as illustrated in FIG. 5D.

Figure 5E:
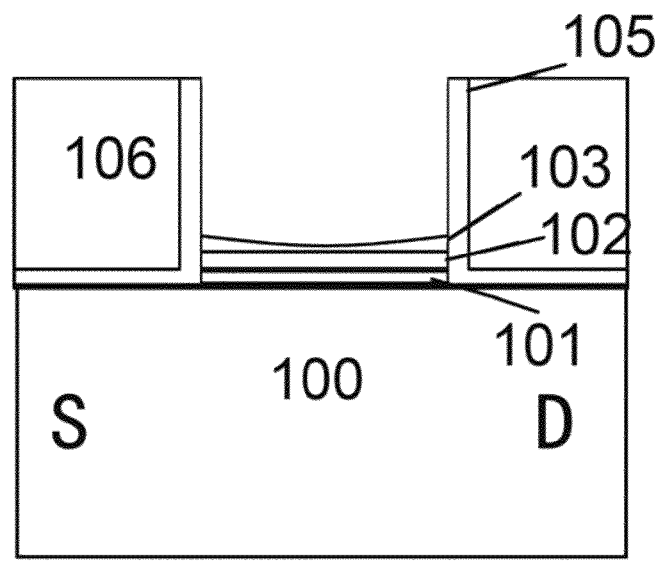

Subsequently, at step S470, the dummy gate layer 104 and a portion of the top TiN layer may be removed using, for example, a dry etching process, wherein the surface interfacial layer between the dummy gate layer 104 and the top TiN layer of the element 103 is completely removed, as illustrated in FIG. 5E. The dry etching process can be, for example, plasma etching.

Figure 5F:
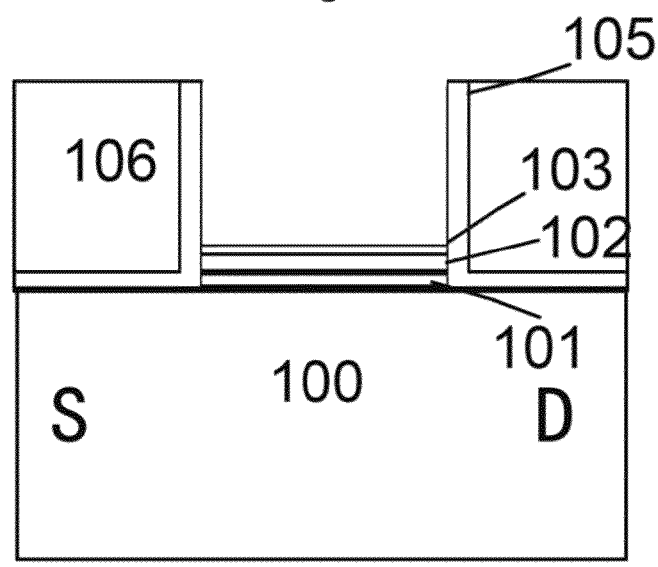

Subsequently, at step S480, remaining portions of the top TiN layer of the element 103 are removed using, for example, a wet etching process, leaving only the bottom TiN layer/TaN layer, as illustrated in FIG. 5F.

The wet etching process can include using a liquid mixture of hydrogen peroxide ($H_2O_2$) and ammonia water ($NH_3OH$) or a liquid mixture of sulphuric acid ($H_2SO_4$) and hydrogen peroxide ($H_2O_2$). The liquid mixture of hydrogen peroxide ($H_2O_2$) and ammonia water ($NH_3OH$) may include (or may consist of) ammonia water (wt 29%), hydrogen peroxide (wt 31%), and de-ionized water, which may have a volume ratio of 1:2:50. The liquid mixture of sulphuric acid ($H_2SO_4$) and hydrogen peroxide ($H_2O_2$) may include (or may consist of) sulphuric acid (wt 98%) and hydrogen peroxide (wt 31%), which may have a volume ratio of 4:1. In one or more embodiments, the structure of FIG. 5E can be immersed in the liquid mixture of hydrogen peroxide ($H_2O_2$) and ammonia water ($NH_3OH$) of a temperature in a range of 40~70° C. In one or more embodiments, the structure of FIG. 5E can be immersed in the liquid mixture of sulphuric acid ($H_2SO_4$) and hydrogen peroxide ($H_2O_2$) of a temperature in a range of 100~180° C.

Figure 5G:
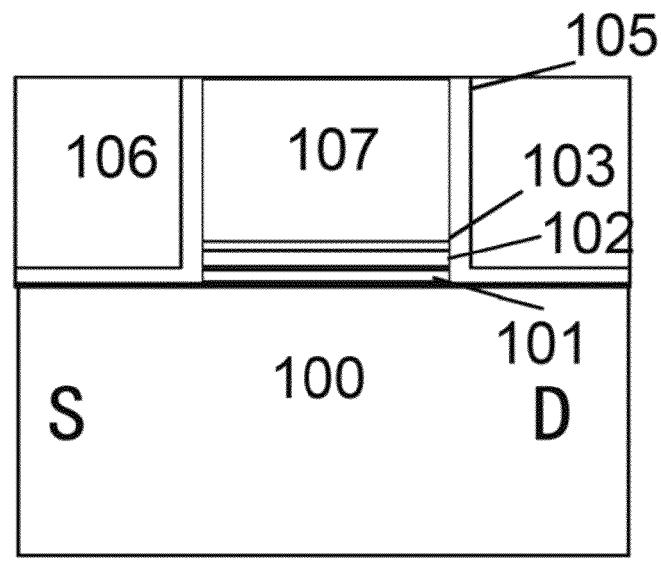

Subsequently, at step S490, a metal gate layer 107 is formed on the bottom TiN layer/TaN layer, as illustrated in FIG. 5G. The metal gate layer 107 can be formed by deposition of metal and planarization.

One of ordinary skill in the art can employ a metal of a proper work function as the material of the metal gate layer 107. The metal gate layer may include, but not limited to, one or more of Al, Cu, Ag, Au, Pt, Ni, Ti, TiN, TaN, Ta, TaC, TaSiN, W, WN, and WSi.

A high-k metal gate structure and the manufacturing method thereof according to one or more embodiments of the present invention have been described in detail. In order to not obscure the concept of the present invention, some details known in the related art may not have been described. One of ordinary skill in the art can understand how to implement the technical solutions and embodiments disclosed herein according to the above description.

Embodiments of the present invention have been described above with reference to the accompanying drawings. It should be understood that these embodiments are illustrative but are not limiting. One of ordinary skill in the art can make various modifications to the embodiments and details of the present invention without departing from the scope of the present invention. The scope of the present invention is defined by the attached claims.

What is claimed is:

1. A method for manufacturing a gate structure, the method comprising:
   providing a first stack on a semiconductor substrate, the first stack including a dummy layer, a first TiN layer disposed between the dummy layer and the semiconductor substrate, a TaN layer disposed between the first TiN layer and the semiconductor substrate, a second TiN layer disposed between the TaN layer and the semiconductor substrate, a first dielectric layer disposed between the second TiN layer and the semiconductor substrate, and an interfacial layer disposed between the first dielectric layer and the semiconductor substrate, wherein a dielectric constant of the first dielectric layer is greater than a dielectric constant of a silicon oxide material;
   etching the first stack to result in a remaining stack that includes a remaining dummy layer, a first remaining TiN layer disposed between the remaining dummy layer and the semiconductor substrate, a remaining TaN layer disposed between the first remaining TiN layer and the semiconductor substrate, a second remaining TiN layer disposed between the remaining TaN layer and the semiconductor substrate, a first remaining dielectric layer disposed between the second remaining TiN layer and the semiconductor substrate, and a remaining interfacial layer disposed between the first remaining dielectric layer and the semiconductor substrate;
   providing a contact etching stop layer on the remaining stack and the semiconductor substrate, wherein the remaining stack is disposed between the semiconductor substrate and a first portion of the contact etching stop layer;
   providing a second dielectric layer on the contact etching stop layer, wherein each of a second portion of the contact etching stop layer and a third portion of the contact etching stop layer is disposed between the semiconductor substrate and the second dielectric layer;
   after the providing the second dielectric layer, performing planarization according to the remaining dummy layer;
   after the planarization, removing the remaining dummy layer and a first portion of the first remaining TiN layer using a dry etching process;
   removing a second portion of the first remaining TiN layer using a wet etching process; and
   providing a metal gate layer on the remaining TaN layer with the remaining TaN layer being disposed between the second remaining TiN layer and the metal gate layer.

2. The method of claim 1, wherein the interfacial layer includes $SiO_2$ or SiON formed by oxidation.

3. The method of claim 1, wherein the first dielectric layer includes one or more of hafnium oxide, hafnium oxide silicon, hafnium oxynitride, hafnium oxynitride silicon, hafnium oxynitride tantalum, zirconium oxide, zirconium oxynitride, zirconium oxynitride silicon, zirconium oxide silicon, lanthanum oxide, titanium oxide, tantalum oxide, barium strontium titanium oxide, barium titanium oxide, strontium titanium oxide, and aluminium oxide, is formed through atomic layer deposition, and has a thickness in a range of 10 Å to 30 Å.

4. The method of claim 1, wherein a TiN—TaN—TiN layer that includes the second TiN layer, the TaN layer, and the first TiN layer is formed through atomic layer deposition, wherein the first TiN layer has a thickness in a range of 10 Å to 30 Å, wherein the TaN layer has a thickness in a range of 10 Å to 30 Å, and wherein the second TiN layer has a thickness in a range of 10 Å to 30 Å.

5. The method of claim 1, wherein the dummy layer includes poly-Si and is formed through chemical vapour deposition or furnace tube deposition, and wherein the dummy layer has a thickness in a range of 400 Å to 800 Å.

6. The method of claim 1, wherein the contact etching stop layer includes SiN or SiNO and is formed through chemical vapour deposition.

7. The method of claim 1, wherein the second dielectric layer includes $SiO_2$ and is formed through chemical vapour deposition.

8. The method of claim 1, wherein the planarization is performed using a chemical-mechanical polishing process.

9. The method of claim 1, wherein the dry etching process includes plasma etching.

10. The method of claim 1, wherein the wet etching process includes using at least one of a liquid mixture of hydrogen peroxide ($H_2O_2$) and ammonia water ($NH_3OH$) and a liquid mixture of sulphuric acid ($H_2SO_4$) and hydrogen peroxide ($H_2O_2$), wherein the liquid mixture of hydrogen peroxide ($H_2O_2$) and ammonia water ($NH_3OH$) has a temperature in a range of 40° C. to 70° C. and includes ammonia water, hydrogen peroxide, and de-ionized water that have a volume ratio of 1:2:50, and wherein the liquid mixture of sulphuric acid ($H_2SO_4$) and hydrogen peroxide ($H_2O_2$) has a temperature in a range of 100° C. to 180° C. and includes sulphuric acid and hydrogen peroxide that have a volume ratio of 4:1.

11. The method of claim 1, wherein the metal gate layer includes one or more of Al, Cu, Ag, Au, Pt, Ni, Ti, TiN, TaN, Ta, TaC, TaSiN, W, WN, and WSi.

* * * * *